(12) United States Patent
Kuriyama

(10) Patent No.: US 8,990,667 B2
(45) Date of Patent: Mar. 24, 2015

(54) ERROR CHECK AND CORRECTION CIRCUIT, METHOD, AND MEMORY DEVICE

(71) Applicant: Samsung Electronics Co., Ltd., Suwon-si, Gyeonggi-Do (KR)

(72) Inventor: Masao Kuriyama, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 62 days.

(21) Appl. No.: 13/958,074

(22) Filed: Aug. 2, 2013

(65) Prior Publication Data

US 2014/0040699 A1  Feb. 6, 2014

(30) Foreign Application Priority Data

Aug. 3, 2012  (JP) .................................. 2012-173182
Apr. 11, 2013 (KR) ......................... 10-2013-0039901

(51) Int. Cl.
*H03M 13/00* (2006.01)
*H03M 13/11* (2006.01)
*H03M 13/15* (2006.01)

(52) U.S. Cl.
CPC ........ *H03M 13/1148* (2013.01); *H03M 13/152* (2013.01); *H03M 13/1545* (2013.01)
USPC ........................................................ 714/785

(58) Field of Classification Search
CPC .......... H03M 13/1148; H03M 13/152; H03M 13/1545
See application file for complete search history.

(56) References Cited

U.S. PATENT DOCUMENTS

2009/0106634 A1   4/2009   Muraoka

FOREIGN PATENT DOCUMENTS

JP    2009-100369 A    5/2009

*Primary Examiner* — Guerrier Merant
(74) *Attorney, Agent, or Firm* — Volentine & Whitt, PLLC

(57) ABSTRACT

An error check and correction method employs a circuit which includes a data storage unit configured to store a data string; a syndrome calculation unit configured to calculate a syndrome from the data string; an error coefficient calculation unit configured to calculate coefficients of an error location search equation using the syndrome; a latch unit configured to store the coefficients; a substitution value calculation unit configured to calculate a substitution value using the coefficients stored in the latch unit and an address; a Chien search unit configured to output an error detection signal indicating for each bit of the data string whether an error exists, in response to a result obtained by substituting the substitution value in the error location search equation; and an error correction unit configured to correct the error in response to the error detection signal indicating that the error exists.

17 Claims, 7 Drawing Sheets

ERROR CHECK AND CORRECTION CIRCUIT, METHOD, AND MEMORY DEVICE

CROSS-REFERENCE TO RELATED APPLICATIONS

A claim for priority under 35 U.S.C. §119 is made to Japanese Patent Application No. 2012-173182 filed Aug. 3, 2012, in the Japanese Intellectual Property Office, the entire contents of which are hereby incorporated by reference.

BACKGROUND

The inventive concepts described herein relate to an error check and correction circuit, method, and a memory device.

A NAND flash memory device may be known as a type of Electrically Erasable and Programmable Read Only Memory (EEPROM). The NAND flash memory device may use a NAND string in which a plurality of memory cells is connected in series, so that it stores data with less chip area.

In the NAND flash memory, a data retention characteristic of a storage element (memory cell) may be reduced according to deterioration of a tunnel oxide film due to iterative overwriting, so that an error rate increases. In particular, as memory cells in the NAND flash memory are scaled down in size, the error rate may increase. Thus, "information data" or raw data may be corrected when error bits are generated by adding an error correcting code (ECC) of redundancy data to the information data to be stored, storing the information data and redundancy data as a data string in a flash memory, and correcting the information data based on the error correcting code of redundancy data upon reading the data. Here, information data or raw data may be understood to be data received by the NAND flash memory from an external device, such as a host, in a data write or data programming operation to be stored in the NAND flash memory, and which subsequently may be supplied by the NAND flash memory to an external device in a data read operation.

For example, Japanese Application Publication No. 2009-100369 discloses a NAND flash memory having an error check and correction circuit (ECC circuit), sometimes also referred to as an error detection and correction circuit. An ECC circuit is a circuit which can identify the presence of one or more errors in a set of data, and then correct the one or more errors, provided that the number of errors in the set of data do not exceed a maximum error correction limit or capability of the ECC circuit. In a Chien search unit of the error check and correction circuit disclosed in the cited reference, a location of a bit of input information (i.e., a location of a bit of data string) may be substituted in an error location search equation, and whether a corresponding bit is erroneous may be detected. At outputting of the data string, information corresponding to addresses ranging from LSB to MSB all may be substituted in the Chien search unit to detect error bits in the data string corresponding to the addresses ranging from the LSB to the MSB. When each bit is erroneous, an error correction circuit may correct a data bit to output the corrected data bit. When an error does not exist, the error correction circuit may output the data bit without correction.

However, in a component disclosed in the cited reference, in the event that a bit, corresponding to any address, of the data string is read, the bit to be read may be output from the error correction circuit and first stored in a buffer memory, and then an address of the bit to be read may be additionally provided to the buffer memory to request the bit to be read. That is, in case of the prior art, the error check and correction circuit may perform error correction on a data bit corresponding to an address until error bit correction on all bits in a data string including the bit to be read is completed. This may mean that data is not read in high speed.

SUMMARY

One aspect of the inventive concept is directed to providing a device including an error check and correction circuit. In some embodiments, the device may comprise a data storage unit configured to store a data string; a syndrome calculation unit configured to calculate a syndrome from the data string; an error coefficient calculation unit configured to calculate coefficients of an error location search equation using the syndrome; a latch unit configured to store the coefficients; a substitution value calculation unit configured to calculate a substitution value, the substitution value being substituted in the error location search equation using the coefficients stored in the latch unit and an address indicating a location of the data string; a Chien search unit configured to output an error detection signal indicating for each bit of the data string whether an error exists, in response to a result obtained by substituting the substitution value in the error location search equation at an output of the data string; and an error correction unit configured to correct the in response to the error detection signal indicating that the error exists.

In example embodiments, the device further comprises a nonvolatile memory cell array configured to store a plurality of data strings.

Another aspect of embodiments of the inventive concept is directed to providing a memory device comprising an error check and correction circuit which includes a data storage unit configured to store a data string; a syndrome calculation unit configured to calculate a syndrome from the data string; an error coefficient calculation unit configured to calculate coefficients of an error location search equation using the syndrome; a latch unit configured to store the coefficients; a substitution value calculation unit configured to calculate a substitution value, the substitution value being substituted in the error location search equation using the coefficients stored in the latch unit and an address indicating a location of the data string; a Chien search unit configured to output an error detection signal indicating for each bit of the data string whether an error exists, in response to a result obtained by substituting the substitution value in the error location search equation at an output of the data string; and an error correction unit configured to correct the error in response to the error detection signal indicating that the error exists, wherein the data storage unit is a circuit configured to store a data string read from storage elements of a memory cell array; and wherein the address is a column address indicating a location of a column of the storage elements.

Yet another aspect of embodiments of the inventive concept is directed to providing a method of checking a data string for errors and correcting errors that are detected. The method includes storing a data string; calculating a syndrome from the data string; calculating coefficients of an error location search equation using the syndrome; storing the coefficients in a latch; calculating a substitution value, the substitution value being substituted in the error location search equation using the coefficients stored in the latch unit and an address indicating a location of the data string; performing a Chien search to output an error detection signal indicating for each bit of the data string whether an error exists, in response to a result obtained by substituting the substitution value in the error location search equation at an output of the data string; and correcting the error in response to the error detection signal indicating that the error exists.

With embodiments of the inventive concept, it is possible to perform error correction on bit data corresponding to an address and to output error corrected data to an external device in high speed.

BRIEF DESCRIPTION OF THE DRAWINGS

Exemplary embodiments of the inventive concept will be more clearly understood from the following detailed description taken in conjunction with the accompanying drawings.

DETAILED DESCRIPTION

Figure 1:
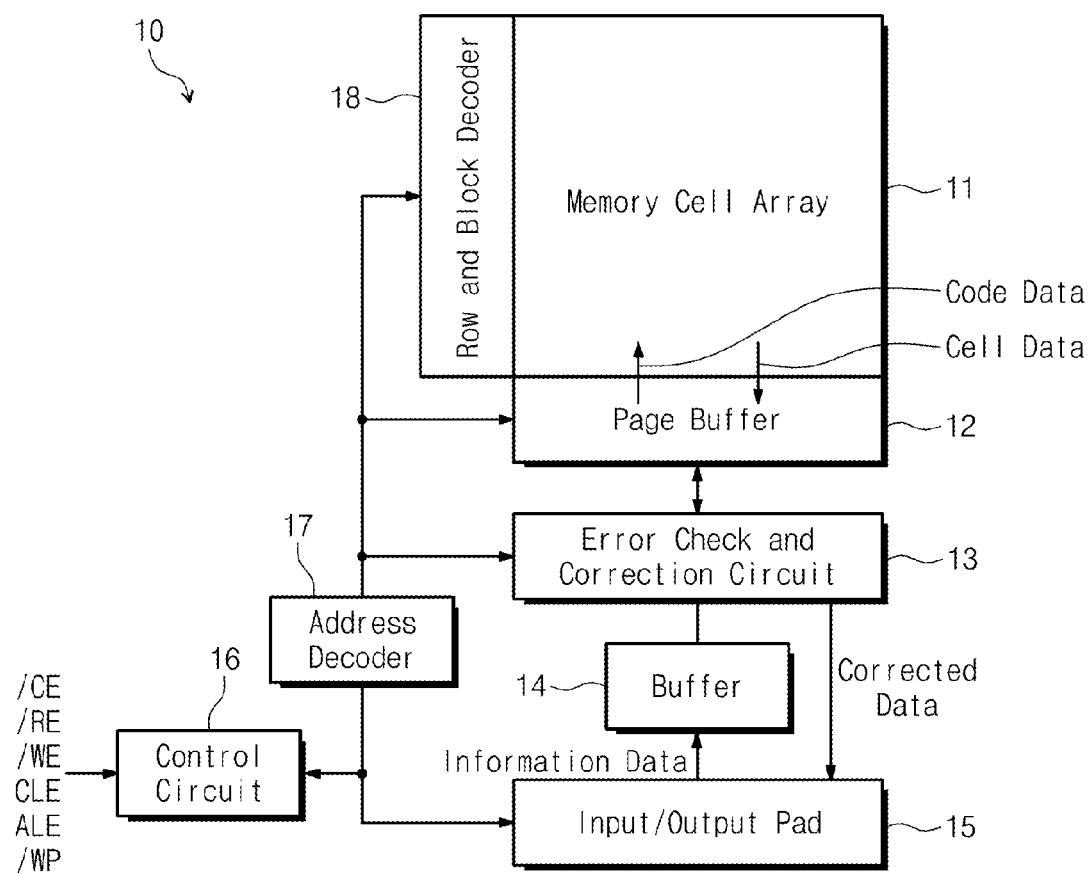
FIG. 1 is a block diagram schematically illustrating an embodiment of a NAND flash memory as a nonvolatile semiconductor memory device.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating an embodiment of a NAND flash memory as a nonvolatile semiconductor memory device 10. Nonvolatile semiconductor memory device 10 may include a memory cell array 11, a page buffer 12, an error check and correction circuit 13, a buffer 14, an I/O pad 15, a control circuit 16, an address decoder 17, and a row and block decoder 18.

Memory cell array 11 may include a plurality of blocks in which a plurality of stack gate structured transistors, that is, electrically overwritable nonvolatile memory cells are connected in series in a column direction, and a plurality of NAND cell strings are disposed in a row direction (an arrangement direction of bit lines). Each block may be a unit of a certain operation such as an erase operation. Memory cells in the same block may be erased simultaneously. The blocks may be disposed in plurality in the arrangement direction of the bit lines. The blocks may be set by a data erase unit of memory cells. In each block, a word line extending in the row direction crossing with a bit line extending in the column direction may be connected with a gate of each of the nonvolatile memory cells in the same row. Nonvolatile memory cells selected by a word line may form a page as a unit of programming and reading. For example, the page may be a storage area formed by respective bits of memory cells accessed simultaneously during the programming and reading.

Page buffer 12 may include page buffer circuits installed for every bit line for reading and programming of data corresponding to a page unit. Each of the page buffer circuits in page buffer 12 may include a latch circuit which is connected with a corresponding bit line and is used as a sense amplifier for amplifying and determining a potential or voltage level of the corresponding bit line.

In a data read operation of nonvolatile semiconductor memory device 10, page buffer 12 may receive cell data, which is data stored at a page of memory cells in memory cell array 11 and substantially identical to data string which is a unit of programming and reading, to amplify the input cell data. The amplified cell data may be output to the error check and correction circuit 13. In a data programming operation of nonvolatile semiconductor memory device 10, page buffer 12 may store data provided from the error check and correction circuit 13 in an internal latch circuit and write all data as code data at a page of memory cells by performing a verification operation.

The code data may include parity bits generated by the error check and correction circuit 13. For example, in case of an error correction system where 4-bit correction is performed using a Bose-Chaudhuri Hocquenghem (BCH) code on a set of 512 bytes of information data, 1-page may include memory cells storing 2 KB data (2048 B), that is, 16K (=16384) information data bits and memory cells storing 208 bits of parity data. Here, "B" may indicate a byte. That is, cell data or code data may include (16K+208) bits. Also, 1-page may be divided into four sectors by a correction unit of error check and correction circuit 13, for example. That is, data corresponding to one sector may be formed of 512 bytes (4096 bits) of information data, and 52 bits of parity data. A sector may be a group of data which are a part of the data string and a basis of the correction unit of error check and correction circuit 13.

In example embodiments, an access of an external device to a memory device may be performed by providing a column address Y[13:0] to the memory device. Parity data may be internal data of the memory device added for correction of errors in information data, and may not be accessed from an external device.

In a data read operation of nonvolatile semiconductor memory device 10, the error check and correction circuit 13 may process cell data read from page buffer 12 by the sector unit to calculate a coefficient of an error location detection polynomial. The calculated result may be latched in error check and correction circuit 13 for storage. In the read operation, also, the error check and correction circuit 13 may correct an error of a data bit whose location is indicated by a column address, to output it as corrected information data to an external device through I/O pad 15. An input/output circuit can be provided between I/O pad 15 and error check and correction circuit 13. Information data may be output through the input/output circuit and I/O pad 15 to the external device.

In a data write operation of nonvolatile semiconductor memory device 10, error check and correction circuit 13 may receive information data received from I/O pad 15 through buffer 14. Error check and correction circuit 13 may generate parity data from the input information data and output the input information data and the parity data to page buffer 12. Page buffer 12 may write the information data and parity data as code data at memory cells connected with a selected page.

Control circuit 16 may receive various control signals to control data programming, read, and erase operations, and a verification operation, on nonvolatile memory cells. For example, the control signals may include an external clock signal, a chip enable signal /CE, a read enable signal /RE, a program enable signal /WE, a command latch enable signal CLE, an address latch enable signal ALE, a write protection signal /WP, and so on.

Control circuit 16 may output internal control signals to each circuit in response to the control signals and an operating mode indicated by command data input from I/O pad 15. For example, control circuit 16 may read command data from I/O pad 15 in response to a low-to-high transition of the command latch enable signal CLE at a first start of the program enable signal /WE. The read command data may be stored at an internal register of control circuit 16.

Address decoder 17 may store an address (including row, block and column addresses) input from I/O pad 15 based on an internal control signal from control circuit 16. Address decoder 17 may output the retained address to row and block decoder 18, page buffer 12, and error check and correction circuit 13 based on the internal control signal from control circuit 16.

For example, control circuit 16 may read an address from I/O pad 15 in response to a low-to-high transition of the address latch enable signal ALE at a first start of the program enable signal /WE. The read address may be stored in an internal register of address decoder 17.

Row and block decoder 18 may select a page of memory cells by selecting a block and a word line of memory cell array 11 in response to the row and block addresses stored at address decoder 17. Address decoder 17 may select a bit line of memory cell array 11 and page buffer 12 in response to the column address internally stored.

In example embodiments, in a data read operation, cell data stored in page buffer 12 may be transferred to error check and correction circuit 13 such that a coefficient of an error location search equation is calculated every sector. Whether bit data, the location of which is indicated by a column address, that is, data (16-bit data) of memory cells, is erroneous may be detected based on a coefficient calculated by a sector unit and the column address. If an error is detected, it may be corrected. Then, corrected data may be output to I/O pad 15. This will be more fully described later.

Also, in a data update operation, cell data stored at page buffer 12 may be transferred to buffer 14. Buffer 14 may be a Static Random Access Memory (SRAM), for example.

In buffer 14, a portion, corresponding to an input column address, from among cell data may be updated with information data from I/O pad 15. Error check and correction circuit 13 may calculate parity data after updating of buffer 14. Page buffer 12 may write encoded data, including parity data, as code data at a selected page.

Figure 2:
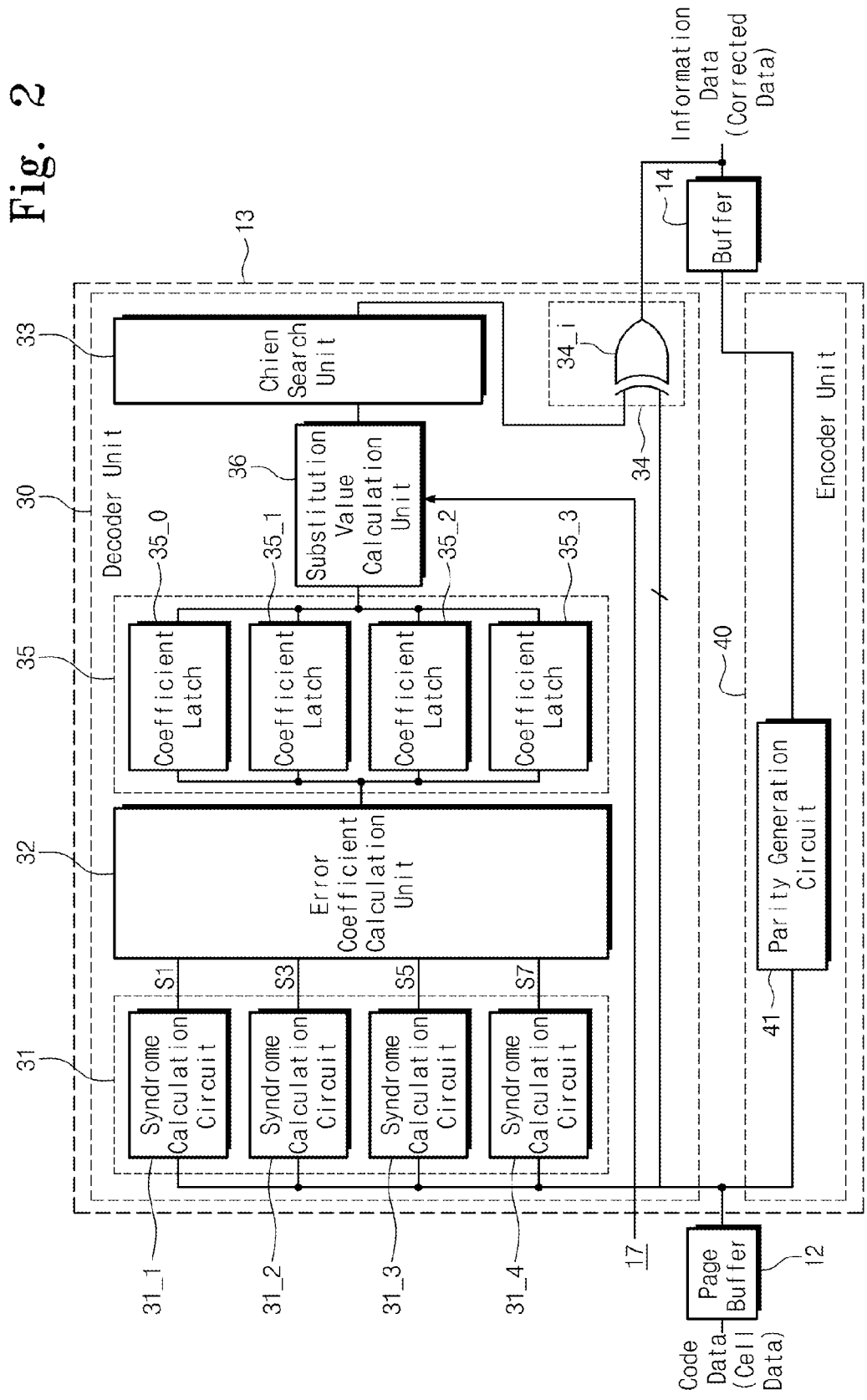
FIG. 2 is a block diagram schematically illustrating a first embodiment of an error check and correction circuit.

FIG. 2 is a block diagram schematically illustrating a first embodiment of an error check and correction circuit 13. In example embodiments as described below, error check and correction circuit 13 an example of an error check and correction circuit (hereinafter, referred to as ECC circuit) for a Bose-Chaudhuri Hocquenghem (BCH) code. ECC circuit 13 may implement a block code using Galois field arithmetic represented by the BCH code. In some embodiments, a modified example of the BCH code, for example, a hamming code or a Reed-Solomon (RS) code may be used. Below, it is assumed that an information data length of 512 B (4096 bits) is a "correction unit" (i.e., data corresponding to a quarter of a page of memory cells is a correction unit), and ECC circuit 13 uses a BCH code capable of correcting 4 data bit errors for each correction unit.

Error check and correction circuit 13 may include a decoder unit 30 to decode code data, and an encoder unit 40 to generate parity data for correction, and to add the parity data to information data to be written in memory cells.

Encoder unit 40 may include a parity generating circuit 41. Parity generating circuit 41 may generate parity data obtained by dividing information data written into buffer 14 by a generation polynomial. Parity generating circuit 41 may add the generated parity data to the information data and output the resulting data to page buffer 12. In a data write operation of nonvolatile semiconductor memory device 10, this output data may be code data written to a selected page. In example embodiments, error check and correction circuit 13 may perform data correction in high speed in a data read operation of nonvolatile semiconductor memory device 10. Below, decoder unit 30 will be more fully described.

Decoder unit 30 may include a syndrome calculation unit 31, an error coefficient calculation unit 32, a Chien search unit 33, an error correction unit 34, a latch unit 35, and a substitution value calculation unit 36.

In a data read operation of nonvolatile semiconductor memory device 10, syndrome calculation unit 31 may receive cell data read by page buffer 12 as code data by a sector unit, and may calculate a syndrome by dividing the input code data by an independent minimal polynomial. Four independent minimal polynomials may be used for a BCH code capable of correcting a data error of up to 4 bits. Syndrome calculation unit 31 may include four syndrome calculation circuits 31_1 to 31_4 respectively corresponding to the four independent minimal polynomials. Syndrome calculation circuits 31_1 to 31_4 may calculate syndromes S1, S3, S5, and S7.

Error coefficient calculation unit 32 may calculate coefficients e4, e3, e2, e1, and e0 of an error location search equation using the syndromes S1, S3, S5, and S7 by a sector unit. The coefficients e4, e3, e2, e1, and e0 may be coefficients of the error location search equation ($\Lambda(x)=e4x^4+e3x^3+e2x^2+e1x^1+e0$) of Chien search unit 33. The error location search equation $\Lambda(x)$ may be used by Chien search unit 33 when there is searched whether data read from page buffer 12 by a sector unit includes error bits.

Here, the composition and operation of Chien search unit 33 will be described to illustrate an error location search equation.

Figure 3:
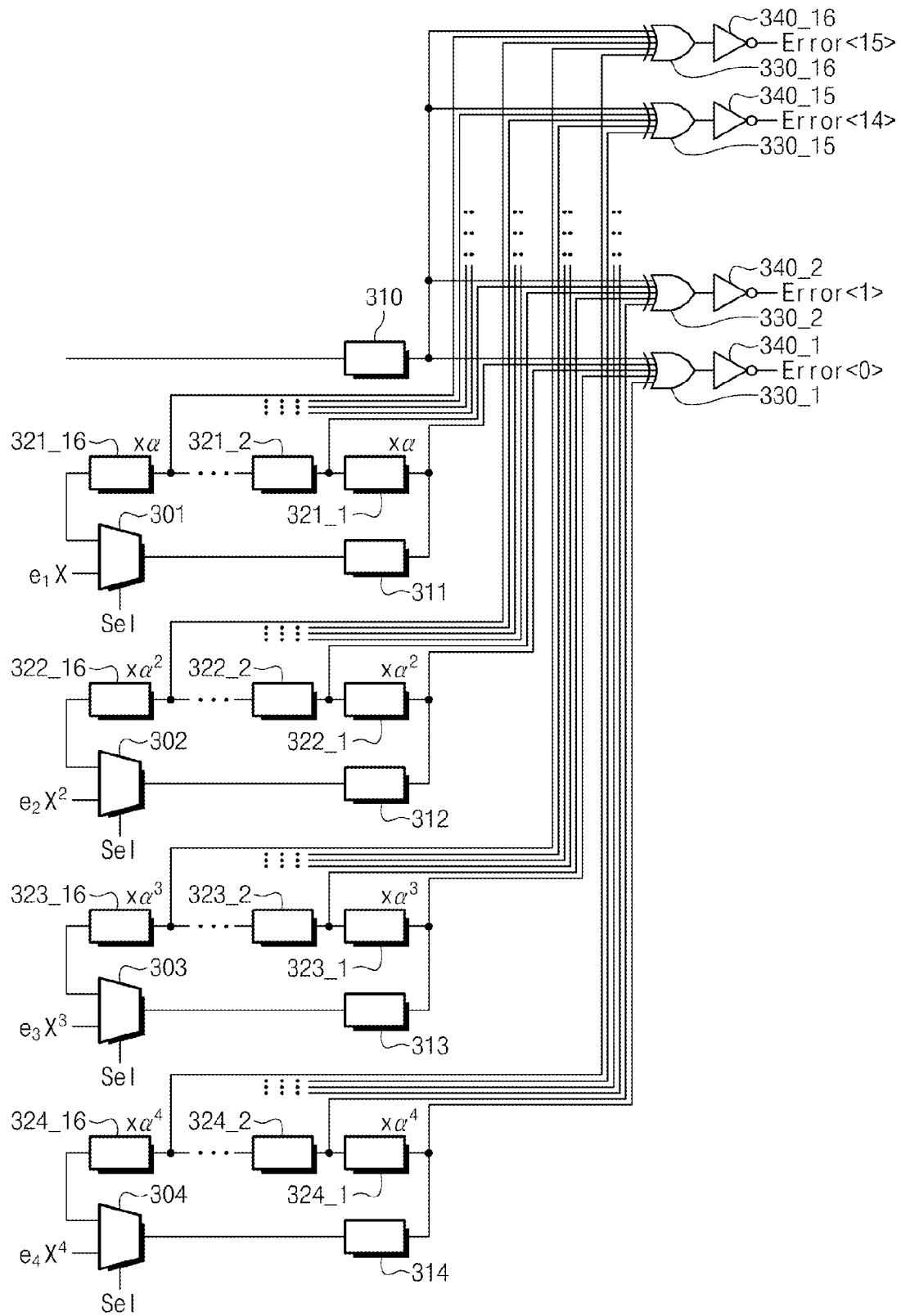
FIG. 3 is a block diagram schematically illustrating an embodiment of a Chien search unit.

FIG. 3 is a block diagram schematically illustrating an embodiment of Chien search unit 33. Chien search unit 33 may include four selectors 301, 302, 303, and 304, 5 flip-flops 310, 311, 312, 313, and 314, 64 integer multiplication circuits 321_1 to 321_16, 322_1 to 322_16, 323_1 to 323_16, and 324_1 to 324_16, 16 exclusive-OR circuits 330_1 to 330_16, and 16 logic inversion circuits 340_1 to 340_16. A symbol x of "e1x, e2x^2, e3x^3, e4x^4" input to the selectors 301 to 304 may be code data, that is, a value indicating a location of cell data stored in page buffer 12. In particular, the following value may be input as 'x'. That is, since 1-page includes 16K-bit data (excluding parity data), a column address indicating a location of a bit line of the memory cell array 11 may be a 14-bit column address Y[13:0]. It is assumed that error correction of data is performed in units of 16 bits. In this case, if 10 upper column address bits Y[13:4] are expressed by "$Y=a13\times2^{13}+a12\times2^{12}+\ldots+a5\times2^5+a4\times2^4$" by a decimal number, "$a13\times2^{13}+a12\times2^{12}+\ldots+a5\times2^5+a4\times2^4+52$" ($=\alpha\hat{}j$) excluding parity bits (52 bits) may be input as 'x'.

Here, i=0 to 15 (integer), and "$\alpha\hat{}(i+j)$" may be a primitive element of the Galois field GF(2^m) and be a minimum value of the column address Y[13:0], that is, a value indicating a location of a column address from a case where all bits of the column address is '0', that is, a value indicating a location of a (j×16+i+1)th bit line.

Here, $\alpha\hat{}(i+j)=\alpha\hat{}i\times\alpha\hat{}j$. Thus, if $x=\alpha\hat{}(i+j)$ is substituted in the error location search equation ($\Lambda(x)=e4x^4+e3x^3+e2x^2+e1x^1+e0$"), the error location search equation $\Lambda(x)$ may be multiplied out as follows.

$$\Lambda(\alpha i + j) = e4(\alpha^{(i+j)})^4 + e3(\alpha^{(i+j)})^3 + e2(\alpha^{(i+j)})^2 + \quad \text{[Equation 1]}$$
$$e1(\alpha^{(i+j)})^1 + e0$$
$$= e4(\alpha^4)^i \cdot (\alpha^4)^j + e3(\alpha^3)^i \cdot (\alpha^3)^j + e2(\alpha^2)^i \cdot (\alpha^2)^j +$$
$$e1(\alpha^1)^i \cdot (\alpha^1)^j + e0(\alpha^0)^i \cdot (\alpha^0)^j$$

Here, the selector 301 may acquire e1($\alpha\hat{}j$). If e1($\alpha\hat{}j$) becomes a positive number times by ($\alpha\hat{}1$)^i times in a range where i is 0 to 15, "$x=\alpha\hat{}(i+j)$" substituted in x^1 of the error location search equation $\Lambda(x)$, that is, 'x' indicating a location of a (j×16+i)th bit line may be acquired. Likewise, the selector 302 may acquire e2($\alpha\hat{}j$). If e2($\alpha\hat{}j$) becomes a positive number times by ($\alpha\hat{}2$)^i times in a range where i is 0 to 15, "$x=\alpha\hat{}(i+j)$" substituted in x^2 of the error location search equation $\Lambda(x)$, that is, 'x' indicating a location of a (j×16+i)th bit line may be acquired. Likewise, the selector 303 may acquire e3($\alpha\hat{}j$). If e3($\alpha\hat{}j$) becomes a positive number times by ($\alpha\hat{}3$)^i times in a range where i is 0 to 15, "$x=\alpha\hat{}(i+j)$" substituted in x^3 of the error location search equation $\Lambda(x)$, that is, 'x' indicating a location of a (j×16+i)th bit line may be acquired. Likewise, the selector 304 may acquire e4($\alpha\hat{}j$). If e4($\alpha\hat{}j$) becomes a positive number times by ($\alpha\hat{}4$)^i times in a range where i is 0 to 15, "$x=\alpha\hat{}(i+j)$" substituted in x^4 of the error location search equation $\Lambda(x)$, that is, 'x' indicating a location of a (j×16+i)th bit line may be acquired.

Thus, a control signal SEL for changing an input of a selector may be transferred from control circuit 16 to each of selectors 301 to 304. In a data read operation of nonvolatile semiconductor memory device 10, the control signal SEL may be a control signal which is changed from a low level to a high level by the control circuit 16 after address decoder 17 latches a column address. If the control signals SEL provided to selectors 301 to 304 have a high level, selectors 301 to 304 may receive e1x, e2x^2, e3x^3, and e4x^4, respectively. The received values may be stored in flip-flops 311 to 314 located at output stages of selectors 301 to 304. Also, a coefficient e0 may be stored in flip-flop 310.

Sixteen (16) integer multiplication circuits may be connected in series to an output stage of each of flip-flops 311 to 314, respectively. Integer multiplication circuits 321_1 to 321_16, each of which multiplies an integer α and an input value, may be connected in series to an output stage of flip-flop 311. Integer multiplication circuits 322_1 to 322_16, each of which multiplies an integer α^2 and an input value, may be connected in series to an output stage of flip-flop 312. Integer multiplication circuits 323_1 to 323_16, each of which multiplies an integer α^3 and an input value, may be connected in series to an output stage of, flip-flop 313. Integer multiplication circuits 324_1 to 324_16, each of which multiplies an integer α^4 and an input value, may be connected in series to an output stage of, flip-flop 314.

Exclusive-OR circuit 330_1 may perform an exclusive-OR operation on outputs of flip-flops 310 to 314 and output a result of the exclusive-OR operation to logic inversion circuit 340_1. Logic inversion circuit 340_1 may invert an output of exclusive-OR circuit 330_1 to output it as an error detection signal Error<0> to error correction unit 34. That is, in exclusive-OR circuit 330_1, if a value of the error location search equation Λ(x) is 0 when "x=α^(i+j)" (i=0) is substituted in the error location search equation (Λ(x)=e4x^4+e3x^3+e2x^2+e1x^1+e0), the error detection signal Error<0> may have a high level (logic 1). If a value of the error location search equation Λ(x) is not 0, the error detection signal Error<0> may have a low level (logic 0).

In example embodiments, error correction unit 34 may include 16 exclusive-OR circuits 34_i (i=0 to 15). One of the exclusive-OR circuits 34_i (i.e., exclusive-OR circuit 34_0) in the embodiment of decoder unit 30 shown in FIG. 2 may receive the error detection signal Error<0> and a bit, corresponding to a location of a (j×16+0)th bit line, of cell data stored at page buffer 12 in a read operation. That is, when the error detection signal Error<0> has a high level, exclusive-OR circuit 34_0 may invert a logic value (0 or 1) of a data bit corresponding to a location of the (j×16+0)th bit line to output it as 1-bit of corrected data. Meanwhile, when the error detection signal Error<0> has a low level, exclusive-OR circuit 34_0 may output a logic value of a data bit corresponding to a location of the (j×16+0)th bit line without correction as 1-bit of corrected data.

Likewise, exclusive-OR circuit 330_i corresponding to "i=1 to 15" of the embodiment of Chien Search Unit 33 shown in FIG. 3 may perform an exclusive-OR operation on outputs of integer multiplication circuit 321_i, integer multiplication circuit 322_i, integer multiplication circuit 323_i, and integer multiplication circuit 323_i, and an output of exclusive-OR circuit 330_i may be provided to logic inversion circuit 340_i. Logic inversion circuit 340_i may invert an output of exclusive-OR circuit 330_i to output it as an error detection signal Error<i> to error correction unit 34. That is, in exclusive-OR circuit 330_i, if a value of the error location search equation Λ(x) is 0 when "x=α^(i+j)" (i=1 to 15) is substituted in the error location search equation (Λ(x)=e4x^4+e3x^3+e2x^2+e1x^1+e0), the error detection signal Error<i> may have a high level. If a value of the error location search equation Λ(x) is not 0, the error detection signal Error<i> may have a low level.

In error correction unit 34, exclusive-OR circuit 34_i may receive the error detection signal Error<i> and a bit, corresponding to a location of a (j×16+i)th bit line, of cell data stored in page buffer 12 in a read operation. That is, when the error detection signal Error<i> has a high level, exclusive-OR circuit 34_i may invert a logic value of a data bit corresponding to a location of the (j×16+i)th bit line to output it as 1-bit of corrected data. Meanwhile, when the error detection signal Error<i> has a low level, exclusive-OR circuit 34_i may output a logic value of a data bit corresponding to a location of the (j×16+i)th bit line without correction as 1-bit of corrected data.

In a NAND flash memory not including an ECC circuit, if a read command, that is, a command directing a data read operation is received, data corresponding to a page may be read from memory cells by page buffer 12. Then, data stored in the page buffer 12 may be sequentially read in synchronization with a read enable signal /RE following a first column address.

Nonvolatile semiconductor memory device 10 including an ECC circuit may include the following operation to support the same read operation as described above. Syndrome calculation unit 31 may calculate a syndrome using data (data stored in the page buffer 12) read from memory cells, and coefficient calculation unit 32 may calculate an error coefficient. As described above, whether an error location search equation Λ(X) is 0 may be checked over changing a column address input to a selector of Chien search unit 33 from LSB. If the checking result indicates that data read from page buffer 12 includes an error, the error may be corrected. Afterwards, corrected data may be output.

However, a NAND flash memory not including an ECC circuit may have a mode of accessing using any column address. In the event that the nonvolatile semiconductor memory device 10 has a mode of accessing using any column address, operations of reading cell data through page buffer 12, performing an error correction operation on a page of data, and storing corrected data may be performed.

In a case of a conventional nonvolatile memory device, since the nonvolatile semiconductor memory device includes a buffer (e.g., SRAM) independently of a page buffer, corrected data all may be stored at the buffer, and then the corrected data may be output to a I/O pad using any column address. Alternatively, after corrected data is stored not at the buffer but at the page buffer, the corrected data may be read from the page buffer.

In the event that nonvolatile semiconductor memory device 10 including an ECC circuit has a mode of accessing using any column address, there may be lengthened a time (hereinafter, referred to as first access overhead) taken until an error correction operation on a page of data is completed, any column address is input, and data of memory cells corresponding to the input column address is read.

Nonvolatile semiconductor memory device 10 may include latch unit 35 and substitution value calculation unit 36 which may make it possible to perform the same random access as a NAND flash memory not including an ECC circuit by reducing the first access overhead.

Latch unit 35 may latch coefficients e4, e3, e2, e1, and e0 of an error location search equation every sector being an ECC unit of a page. A coefficient latch 35_0 may store coefficients e4, e3, e2, e1, and e0 of an error location search equation calculated from data (512 B data) of a sector 0 and parity data corresponding to the sector 0. Also, two upper column address bits Y[13:12] of a column address Y[13:0] indicating a location of memory cells storing data of the sector 0 may be expressed by a column address Y[13:12]=(0, 0).

A coefficient latch 35_1 may store coefficients e4, e3, e2, e1, and e0 of an error location search equation calculated from data (512 B data) of a sector 1 and parity data corresponding to the sector 1. Also, two upper column address bits Y[13:12] of a column address Y[13:0] indicating a location of memory cells storing data of the sector 0 may be expressed by a column address Y[13:12]=(0, 1). A coefficient latch 35_2 may store coefficients e4, e3, e2, e1, and e0 of an error location search equation calculated from data (512 B data) of a sector 2 and parity data corresponding to the sector 2. Also, two upper column address bits Y[13:12] of a column address Y[13:0] indicating a location of memory cells storing data of the sector 0 may be expressed by a column address Y[13:12]=(1, 0).

A coefficient latch 35_3 may store coefficients e4, e3, e2, e1, and e0 of an error location search equation calculated from data (512 B data) of a sector 3 and parity data corresponding to the sector 3. Also, two upper column address bits Y[13:12] of a column address Y[13:0] indicating a location of memory cells storing data of the sector 0 may be expressed by a column address Y[13:12]=(1, 1).

Figure 4:
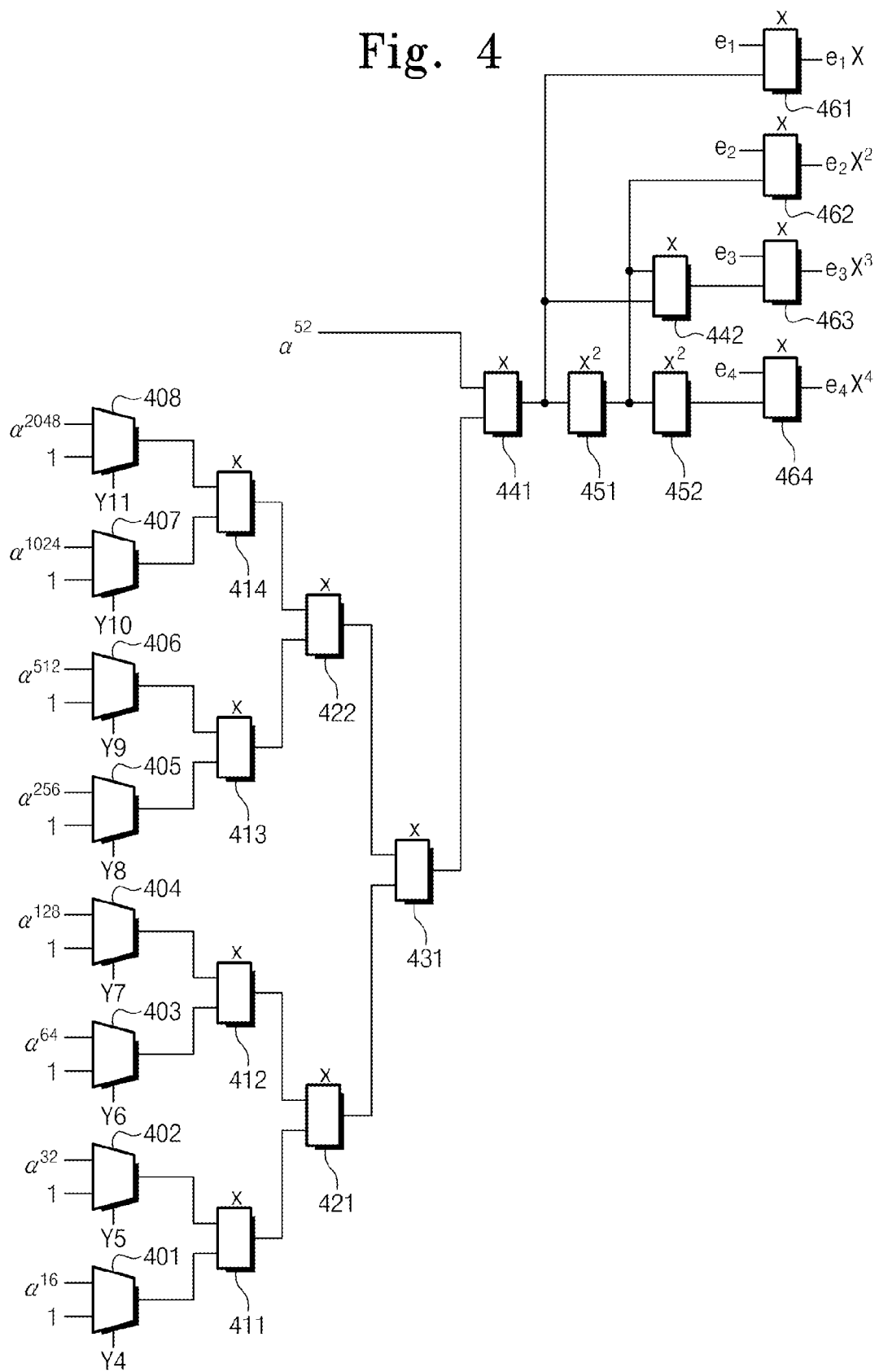
FIG. 4 is a block diagram schematically illustrating an embodiment of a substitution value calculation unit.

FIG. 4 is a block diagram schematically illustrating an embodiment of substitution value calculation unit 36. Substitution value calculation unit 36 may include 8 selectors 401, 402, 403, 404, 405, 406, 407, and 408, 13 multiplication circuits 411, 412, 413, 414, 421, 422, 431, 441, 442, 461, 462, 463, and 464, and two square operation circuits 451 and 452.

Each selector may receive a value of $\alpha\char`\^(2\char`\^j)$ (j=4 to 12) and 1, and may select one of the input values in response to an address signal Yj. The selected value may be output to a following multiplication circuit. A value of $\alpha\char`\^(2\char`\^j)$ may indicate a $(2\char`\^+52)$th location of code data substituted in the above-described error location search equation $\Lambda(x)$. The $(2\char`\^+52)$th location of code data may indicate a location of a $(2\char`\^j+52)$th bit line of bit lines including bit lines corresponding to a parity bit. Also, the column address signal Yj may be one bit Y[j] of a column address Y[13:0].

When an input column address signal Yj has a high level (Y[j]=1), each selector may select a value of $\alpha\char`\^(2\char`\^j)$. Meanwhile, when an input column address signal Yj has a low level (Y[j]=0), each selector may select a value of 1.

For example, when one bit Y[4] of ten upper column address bits ([13:4] is '1' and the remaining upper column address bits all are '0', selector 401 may select '$\alpha\char`\^16$', and the remaining selectors 402 to 408 may select '1'. Below, connection and operation of another circuit of substitution value calculation unit 36 will be described. Also, there will be described an example where "$x=\alpha\char`\^(16+52)$" indicating a $(2\char`\^4+52)$th location of code data is provided to Chien search unit 33.

Multiplication circuit 411 may be connected to outputs of selectors 401 and 402 to multiply output values of selectors 401 and 402. An output value of multiplication circuit 411 may be provided to a first input terminal of multiplication circuit 421. In the above example, a multiplication result may be $\alpha\char`\^16$, and $\alpha\char`\^16$ may be provided to the first input terminal of multiplication circuit 421.

Multiplication circuit 412 may be connected to outputs of selectors 403 and 404 to multiply output values of selectors 403 and 404. An output value of multiplication circuit 412 may be provided to a second input terminal of multiplication circuit 421. In the above example, a multiplication result may be 1, and a value of 1 may be provided to the second input terminal of multiplication circuit 421.

Multiplication circuit 413 may be connected to outputs of selectors 405 and 406 to multiply output values of selectors 405 and 406. An output value of multiplication circuit 413 may be provided to a first input terminal of multiplication circuit 422. In the above example, a multiplication result may be 1, and a value of 1 may be provided to the second input terminal of multiplication circuit 422.

Multiplication circuit 414 may be connected to outputs of selectors 407 and 408 to multiply output values of selectors 407 and 408. An output value of multiplication circuit 414 may be provided to a second input terminal of multiplication circuit 422. In the above example, a multiplication result may be 1, and a value of 1 may be provided to the second input terminal of multiplication circuit 422.

Multiplication circuit 421 may be connected to outputs of multiplication circuits 411 and 412 to multiply output values of multiplication circuits 411 and 412. An output value of multiplication circuit 421 may be provided to a first input terminal of multiplication circuit 431. In the above example, a multiplication result may be $\alpha\char`\^16$, and $\alpha\char`\^16$ may be provided to the first input terminal of multiplication circuit 431.

Multiplication circuit 422 may be connected to outputs of multiplication circuits 413 and 414 to multiply output values of multiplication circuits 413 and 414. An output value of multiplication circuit 422 may be provided to a second input terminal of multiplication circuit 431. In the above example, a multiplication result may be 1, and a value of 1 may be provided to the second input terminal of multiplication circuit 431.

Multiplication circuit 431 may be connected to outputs of multiplication circuits 421 and 422 to multiply output values of multiplication circuits 421 and 422. An output value of multiplication circuit 431 may be provided to a first input terminal of multiplication circuit 441. In the above example, a multiplication result may be $\alpha\char`\^16$, and $\alpha\char`\^16$ may be provided to the first input terminal of multiplication circuit 441.

In multiplication circuit 441, the first input terminal may be connected to an output terminal of multiplication circuit 431 to receive an output value of multiplication circuit 431, and the second input terminal may receive $\alpha\char`\^52$ being a fixed value. The value $\alpha\char`\^52$ may indicate a location of a bit line for generally reading data, located following parity bits (52 bits), from among cell data (i.e., code data) stored in page buffer 12, that is, a value indicating a location of a bit line for generally reading data by a column address Y[13:0] (=0).

Multiplication circuit 441 may multiply an output value of multiplication circuit 431 and $\alpha\char`\^52$ to output a result to an input terminal of square operation circuit 451, a first input terminal of multiplication circuit 442, and a first input terminal of multiplication circuit 461. In the above example, a multiplication result may be "$\alpha\char`\^(16+52)$", and "$\alpha\char`\^(16+52)$" may be provided to the input terminal of square operation circuit 451, the first input terminal of multiplication circuit 442, and the first input terminal of multiplication circuit 461.

Square operation circuit 451 may be connected to an output terminal of multiplication circuit 441 to square an output value of multiplication circuit 441. An output of square operation circuit 451 may be provided to the second input terminal of multiplication circuit 442 and the first input terminal of multiplication circuit 462. In the above example, a square result may be "$\alpha\char`\^((16+52)\times2)$", and "$\alpha\char`\^((16+52)\times2)$" may be provided to the second input terminal of multiplication circuit 442 and the first input terminal of multiplication circuit 462.

Multiplication circuit 442 may be connected to an output terminal of multiplication circuit 441 and an output terminal of square operation circuit 451 to multiply output values of multiplication circuit 441 and square operation circuit 451. An output of multiplication circuit 442 may be provided to a first input terminal of multiplication circuit 463. In the above example, a square result may be "$\alpha\char`\^((16+52)\times3)$", and "$\alpha\char`\^((16+52)\times3)$" may be provided to the first input terminal of multiplication circuit 463.

Square operation circuit 452 may be connected to an output terminal of square operation circuit 451 to square an output value of square operation circuit 451. An output of square operation circuit 452 may be provided to a first input terminal of multiplication circuit 464. In the above example, a square result may be "$\alpha\char`\^((16+52)\times4)$", and "$\alpha\char`\^(16+52)\times4)$" may be provided to the first input terminal of multiplication circuit 464.

Multiplication circuit 461 may be connected to an output terminal of a coefficient latch in latch unit 35 and an output terminal of multiplication circuit 441 to multiply output values of the coefficient latch and multiplication circuit 441. A multiplication result of multiplication circuit 461 may be provided to Chien search unit 33 as "e1x". In the above example, the coefficient latch may be coefficient latch 35_0, an error coefficient e1 may be provided to a second input terminal of multiplication circuit 461, and "e1($\alpha\char`\^(16+52)$)", that is, "($\alpha\char`\^(16+52)$)" as 'x', may be provided to selector 301 of Chien search unit 33.

Multiplication circuit 462 may be connected to an output terminal of a coefficient latch in latch unit 35 and an output terminal of square operation circuit 451 to multiply output values of the coefficient latch and square operation circuit 451. A multiplication result of multiplication circuit 461 may be provided to Chien search unit 33 as "e2x^2". In the above example, the coefficient latch may be coefficient latch 35_0, an error coefficient e2 may be provided to a second input terminal of multiplication circuit 462, and a multiplication result of multiplication circuit 462 may be "e2($\alpha$^((16+52)× 2))". Thus, "e2($\alpha$^((16+52)×2))", that is, "($\alpha$^(16+52))" as 'x', may be provided to selector 302 of Chien search unit 33.

Multiplication circuit 463 may be connected to an output terminal of a coefficient latch in latch unit 35 and an output terminal of multiplication circuit 442 to multiply output values of the coefficient latch and multiplication circuit 442. A multiplication result of multiplication circuit 463 may be provided to Chien search unit 33 as "e3x^3". In the above example, the coefficient latch may be coefficient latch 35_0, an error coefficient e3 may be provided to a second input terminal of multiplication circuit 463, and a multiplication result of multiplication circuit 463 may be "e3($\alpha$^((16+52)× 3))". Thus, "e3($\alpha$^((16+52)×3))", that is, "($\alpha$^((16+52))" as 'x', may be provided to selector 303 of Chien search unit 33.

Multiplication circuit 464 may be connected to an output terminal of a coefficient latch in latch unit 35 and an output terminal of square operation circuit 452 to multiply output values of the coefficient latch and square operation circuit 452. A multiplication result of multiplication circuit 464 may be provided to Chien search unit 33 as "e4x^4". In the above example, the coefficient latch may be coefficient latch 35_0, an error coefficient e4 may be provided to a second input terminal of multiplication circuit 464, a multiplication result of multiplication circuit 464 may be "e4($\alpha$^((16+52)×4))". Thus, "e4($\alpha$^((16+52)×4))", that is, "($\alpha$^((16+52))" as 'x', may be provided to selector 304 of Chien search unit 33.

As described above, substitution value calculation unit 36 may calculate a substitution value (e.g., x=$\alpha$(16+52)) substituted in the error location search equation $\Lambda$(x) using an address (a column address Y) indicating a location of a data string and coefficients (coefficients e1 to e4 of the error location search equation) stored in latch unit 35.

Thus, if error coefficients of respective sectors are stored in latch unit 35, a substitution value x substituted in the error location search equation $\Lambda$(x) may be calculated according to the error coefficients and a column address Y[13:4] when data is read from memory cells.

As described above, if a substitution value x is input, Chien search unit 33 may check whether the error location search equation $\Lambda$(x) on 16 bits (e.g., 16 bits of "x=$\alpha$^(16+52), $\alpha$^(17+52), $\alpha$^(18+52), ..., $\alpha$^(30+52), $\alpha$^(31+52)") using the substitution value x as an initial value is 0. Also, Chien search unit 33 may output error detection signals ERR<0> to ERR<15> according to the checking result.

As address decoder 17 provides a column address to page buffer 12, error correction unit 34 may receive data of memory cells indicated by the column address. When the input data is in error, error correction unit 34 may correct an error in response to an error detection signal from Chien search unit 33. When input data is not in error, error correction unit 34 may output the input data without correction.

Below, effects associated with shortening of a delay time (first access overhead) of ECC processing in nonvolatile semiconductor memory device 10 including error check and correction circuit 13 having latch unit 35 and substitution value calculation unit 36 will be described.

Figure 5:
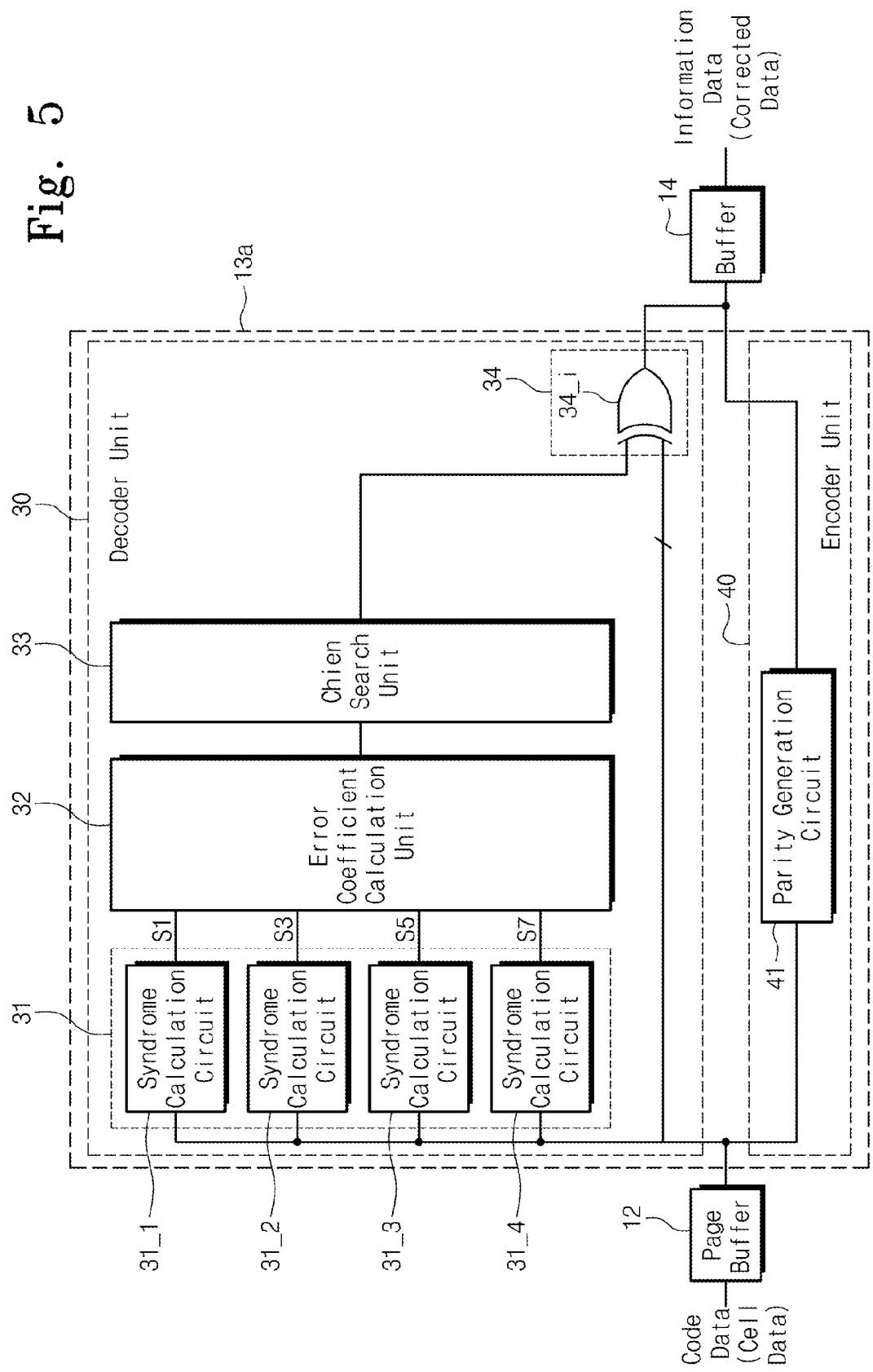
FIG. 5 is a block diagram schematically illustrating a second embodiment of an error check and correction circuit.
Figure 6A:
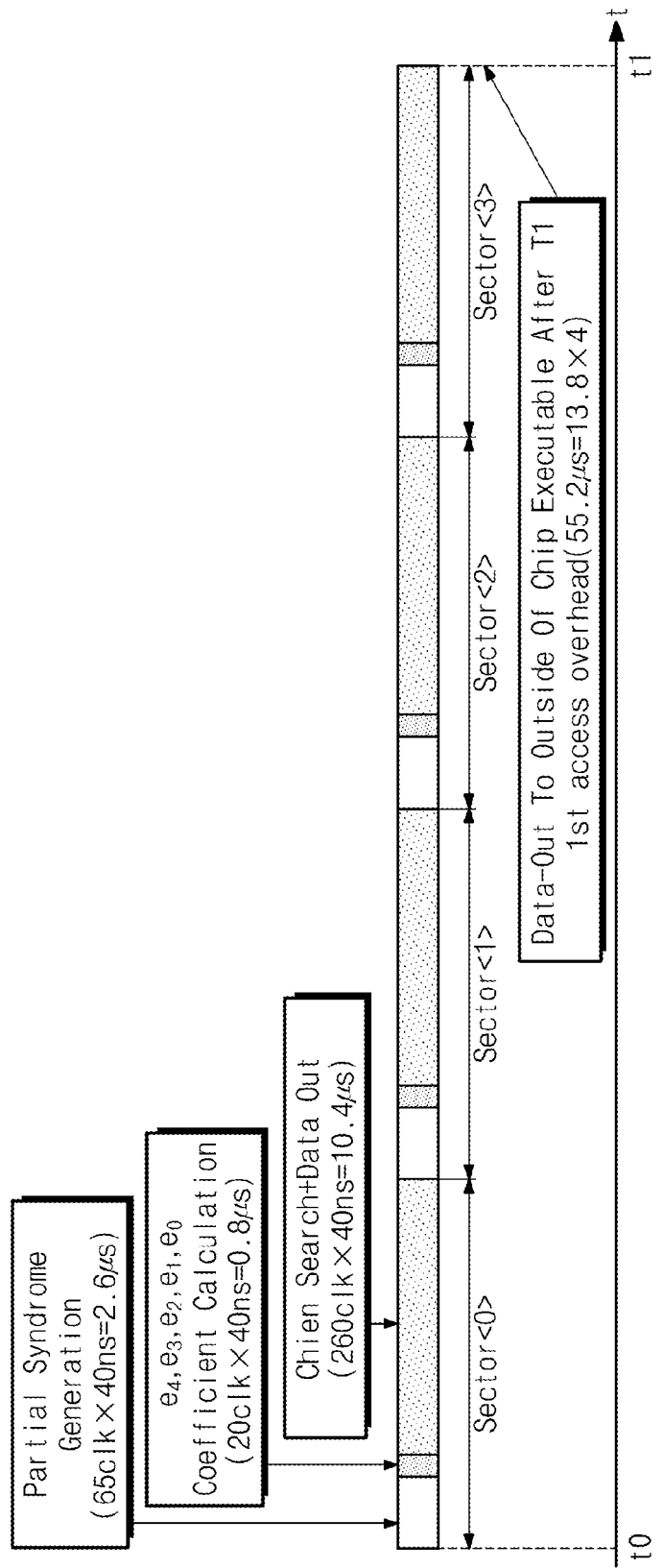
FIG. 6A is a diagram illustrating timing of an example operation of the first embodiment of an error check and correction circuit.
Figure 6B:
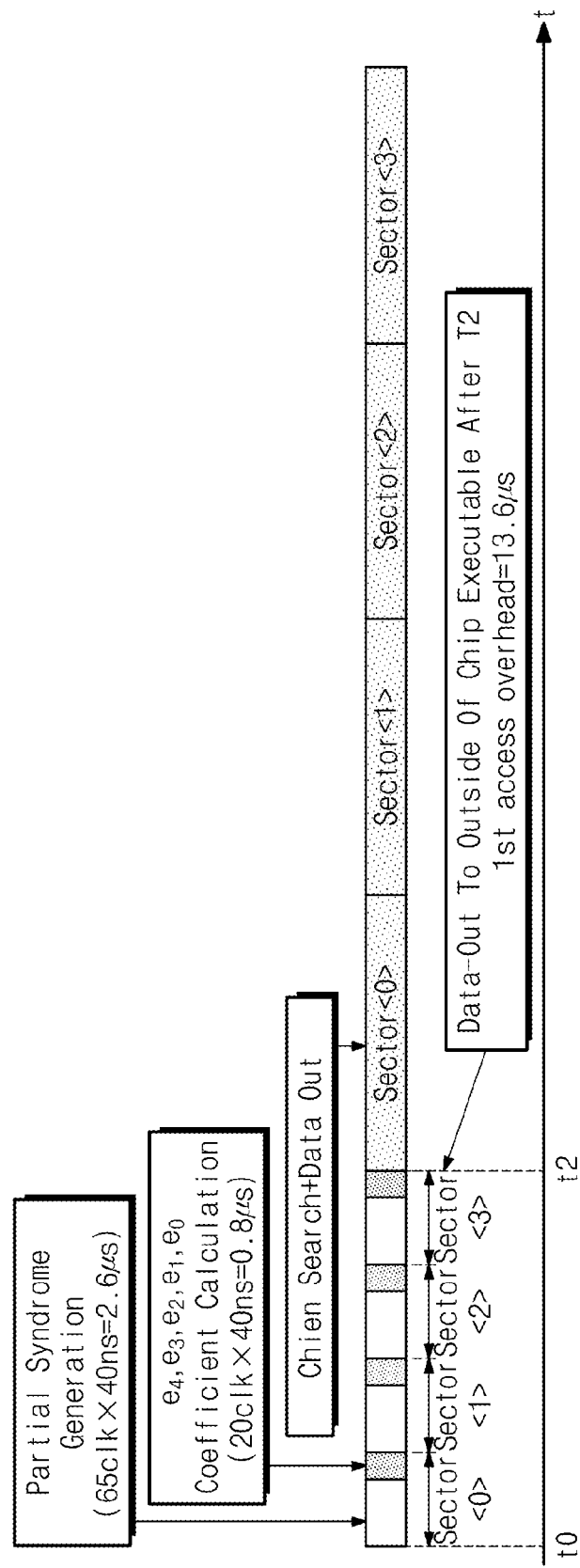
FIG. 6B is a diagram illustrating timing of an example operation of the second embodiment of an error check and correction circuit.

FIG. 5 is a block diagram schematically illustrating a second embodiment of an error check and correction circuit 13a. FIGS. 6A and 6B are diagrams for comparing operations of error check and correction circuit 13 and error check and correction circuit 13a.

In FIG. 5, components which are to the same as those in FIG. 2 may be marked by the same reference numerals, and a description thereof is thus omitted.

Error check and correction circuit 13a may be different from error check and correction circuit 13 of FIG. 2 in that error check and correction circuit 13a does not include latch unit 35 and substitution value calculation unit 36. Also, check and correction circuit 13a may be different from error check and correction circuit 13 of FIG. 2 in that an output of error correction unit 34 is provided to I/O pad 15 through buffer 14 as corrected data.

Below, an example of a first access overhead of each of the error check and correction circuits 13 and 13a will be described with reference to FIGS. 6A and 6B.

In error check and correction circuit 13a, the number of decoded data bits of a sector may be a sum of 4096 information bits (=512 KB) and 52 parity bits (=13 column address bits×4). To calculate such data in a lump may be impractical in consideration of an increase in a circuit size. Thus, in some embodiments, syndrome calculation unit 31 may calculate in units of 64 bits.

Assuming in this example that a period of a clock signal as a reference for calculation is 40 ns, a calculation time for each syndrome calculation circuit in syndrome calculation unit 31 may require "(4096+52)bits/(64 bits/clock cycle)≈65 clock cycles" and be "(40 ns/clk)×(65 clks)=2.6 $\mu$s".

Also, in this example each syndrome calculation circuit in syndrome calculation unit 31 may require "(40 ns/clk)×20 clks=0.8 $\mu$s" to calculate the solution of a fourth-order equation (i.e., to find coefficients e4, e3, e2, e1, and e0 of an error location search equation). As described above, Chien search unit 33 may determine whether 16 bits are erroneous in one lump. A calculation time required for this determination may require "(4096+52)bits/(16 bits/clk)≈260 clk" and be "(40 ns/clk)×(260 clks)=10.4 $\mu$s". Error correction unit 34 may correct input data simultaneously with determination of Chien search unit 33, that is, perform correction on the input data using an error detection signal, so that a calculation time is not required separately.

That is, in this example the time required for ECC processing by ECC 13a may be a sum of the above-described calculation times, that is, "2.6 $\mu$s+0.8 $\mu$s+10.4 $\mu$s=13.8 $\mu$s" on 5128 of a sector. FIG. 6A shows that ECC processing is performed in an order of a sector 0 Sector<0>, a sector 1 Sector<1>, a sector 2 Sector<2>, and a sector 3 Sector<3>. Syndrome calculation circuit 31_1 of syndrome calculation unit 31 may require 2.6 $\mu$s to calculate a sum of Partial syndromes. Error coefficient calculation unit 32 may require 0.8 $\mu$s to calculate coefficients e4, e3, e2, e1, and e0 of an error location search equation. Chien search unit 33 may require 10.4 $\mu$s to correct input data. Also, it is assumed that since the time (data-out from an SRAM) needed for writing of buffer 14 is short, it is included in 10.4 $\mu$s.

As illustrated with reference to FIG. 6A, in this example the above-described ECC processing may be executed by ECC 13a with respect to sectors Sector<2> to Sector<4> to be terminated at t1 when a time 55.2 $\mu$s elapses from the start of the ECC processing. That is, that an external device provides any column address and reads bit data indicated by the column address may be impossible until data of memory cells in a page is corrected and the corrected data is stored in buffer 14. So, in this example, the time t1 until errors of memory cells in a page are corrected and the corrected data is stored in buffer 14 may be 55.2 $\mu$s as a first access overhead for ECC 13a. In some cases, this first access overhead may be about twice as long compared with that of a similar NAND flash memory not including an ECC circuit.

On the other hand, in error check and correction circuit 13, if reading of cell data from memory cells to page buffer 12 is executed, syndrome calculation circuits in syndrome calculation unit 31 may sequentially calculate syndromes by a sector unit based on a page of data. Also, error coefficient calculation unit 32 may calculate a solution of a fourth-order equation (i.e. find coefficients e4, e3, e2, e1, and e0 of an error location search equation) sequentially for every sector. FIG. 6B illustrates that partial syndromes and coefficients e4, e3, e2, e1, and e0 of the error location search equation are sequentially calculated with respect to a sector 0 Sector<0>, a sector 1 Sector<1>, a sector 2 Sector<2>, and a sector 3 Sector<3> from t0. In this example, such a calculation may require a time of 13.6 μs from the start of the ECC processing and be terminated at t2. Also, the processing time of each calculation may be the same as that of error check and correction circuit 13a.

At t2, coefficient latches of latch unit 35 may latch coefficients e4, e3, e2, e1, and e0 of the error location search equation on sector 1 to the sector 4. That is, if any column address is provided to substitution value calculation unit 36 after t2, Chien search unit 33 may determine whether bit data indicated by the column address is erroneous. Also, error correction unit 34 may detect and correct an error of cell data directed by the column address to output corrected data to an external device through I/O pad 15. That is, compared with error check and correction circuit 13a, error check and correction circuit 13 may not require an operation of writing data to buffer 14 after correction on a page of memory cells, so that, in this example, the first access overhead is reduced to 13.6 μs. Also, in FIG. 6B, an output of data to an external device may be marked in an arrangement order (an order of column addresses) of bit data in page buffer 12, that is, in a sector order. However, a random access may be possible after t2, and it is possible to correct an error of a data bit at any location of a sector and immediately output the corrected data. That is, a calculation time needed before data output may include only a time taken to calculate coefficients for correction (e.g., a calculation time (in this example, about 40 ns) of substitution value calculation unit 36 and Chien search unit 33). Thus, the first access overhead may be significantly reduced compared with that of error check and correction circuit 13a.

Error check and correction circuit 13 may include a syndrome calculation unit 31 configured to calculate a syndrome from the data string; error coefficient calculation unit 32 configured to calculate coefficients of an error location search equation using the syndrome; latch unit 35 configured to store the coefficients; substitution value calculation unit 36 configured to calculate a substitution value x substituted in the error location search equation $\Lambda(x)$ using the coefficients stored in latch unit 35 and an address (a column address) indicating a location of the data string; Chien search unit 33 configured to output an error detection signal ERR<i> indicating whether an error exists at a bit of the data string, in response to a result obtained by substituting the substitution value x in the error location search equation $\Lambda(x)$ at outputting of the data string; and error correction unit 34 configured to correct an error of bit data of the data string according to the error detection signal ERR<i>.

Error check and correction circuit 13 may include latch unit 35 configured to store coefficients of an error location search equation; and substitution value calculation unit 36 configured to calculate substitution values of the error location search equation such as coefficients, bit locations, and so on. If an address (a column address) of a read bit is provided to substitution value calculation unit 36 at a data read operation, Chien search unit 33 may detect whether corresponding bit data is erroneous. If corresponding bit data is erroneous, error correction unit 34 may correct the bit data to output the corrected bit data. If corresponding bit data is not erroneous, error correction unit 34 may output the bit data without correction. Thus, there may be provided an error check and correction circuit capable of correcting one or more data errors, corresponding to any address, from among a data string (cell data), and outputting corrected data in high speed, and a memory device including the error check and correction circuit.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A device, comprising:
a data storage unit configured to store a data string;
a syndrome calculation unit configured to calculate a syndrome from the data string;
an error coefficient calculation unit configured to calculate coefficients of an error location search equation using the syndrome;
a latch unit configured to store the coefficients;
a substitution value calculation unit configured to calculate a substitution value, the substitution value being substituted in the error location search equation using the coefficients stored in the latch unit and an address indicating a location of the data string;
a Chien search unit configured to output an error detection signal indicating for each bit of the data string whether an error exists, in response to a result obtained by substituting the substitution value in the error location search equation at an output of the data string; and
an error correction unit configured to correct the error in response to the error detection signal indicating that the error exists.

2. The device of claim 1, further comprising a nonvolatile memory cell array configured to store a plurality of data strings.

3. The device of claim 2, further comprising an encoder unit configured to receive information data and to encode the information data.

4. The device of claim 3, further comprising:
a buffer configured to receive and store the information data and supply the stored information data to the encoder unit; and
a page buffer configure to receive the encoded information data and to store the encoded information data as the data strings,
wherein the encoder unit generates parity data and adds the generated parity data to the information data to produce the encoded information data.

5. The device of claim 2, wherein the nonvolatile memory cell array is connected to the data storage unit and configured to communicate the data string to the data storage unit.

6. The device of claim 1, further comprising an address decoder configured to store the address indicating the location of the data string, and to provide the address to the substitution value calculation unit.

7. The device of claim 6, wherein the address includes a column address, and wherein the address decoder is configured to supply the column address to the data storage unit.

8. The device of claim 7, wherein the substitution value calculation unit includes a plurality of selectors, each selector having a first input connected to receive a data bit and a second input connected to receive a fixed value, and wherein the selectors are each configured to respond to a corresponding bit of the column address to select one of the first and second inputs.

9. A memory device, comprising:
- a data storage unit configured to store a data string; and
- an error check and correction circuit including:
  - a syndrome calculation unit configured to calculate a syndrome from the data string;
  - an error coefficient calculation unit configured to calculate coefficients of an error location search equation using the syndrome;
  - a latch unit configured to store the coefficients;
  - a substitution value calculation unit configured to calculate a substitution value, the substitution value being substituted in the error location search equation using the coefficients stored in the latch unit and an address indicating a location of the data string;
  - a Chien search unit configured to output an error detection signal indicating for each bit of the data string whether an error exists, in response to a result obtained by substituting the substitution value in the error location search equation at an output of the data string; and
  - an error correction unit configured to correct the error in response to the error detection signal indicating that the error exists,
- wherein the data storage unit is a circuit configured to store a data string read from storage elements of a memory cell array; and
- wherein the address is a column address indicating a location of a column of the storage elements.

10. The memory device of claim 9, further comprising the memory cell array, the memory cell array being configured to store a plurality of data strings.

11. The device of claim 10, further comprising an encoder unit configured to receive information data and to encode the information data.

12. The device of claim 11, further comprising:
- a buffer configured to receive and store the information data and supply the stored information data to the encoder unit; and
- a page buffer configure to receive the encoded information data and to store the encoded information data as the data strings,
- wherein the encoder unit generates parity data and adds the generated parity data to the information data to produce the encoded information data.

13. The device of claim 10, wherein the memory cell array is connected to the data storage unit and configured to communicate the data string to the data storage unit.

14. The memory device of claim 9, further comprising an address decoder configured to store the address indicating the location of the data string, and to provide the address to the substitution value calculation unit.

15. The memory device of claim 14, wherein the address includes a column address, and wherein the address decoder is configured to supply the column address to the data storage unit.

16. The memory device of claim 15, wherein the substitution value calculation unit includes a plurality of selectors, each selector having a first input connected to receive a data bit and a second input connected to receive a fixed value, and wherein the selectors are each configured to respond to a corresponding bit of the column address to select one of the first and second inputs.

17. A method, comprising:
- storing a data string;
- calculating a syndrome from the data string;
- calculating coefficients of an error location search equation using the syndrome;
- storing the coefficients in a latch;
- calculating a substitution value, the substitution value being substituted in the error location search equation using the coefficients stored in the latch unit and an address indicating a location of the data string;
- performing a Chien search to output an error detection signal indicating for each bit of the data string whether an error exists, in response to a result obtained by substituting the substitution value in the error location search equation at an output of the data string; and
- correcting the error in response to the error detection signal indicating that the error exists.

* * * * *